United States Patent
Jung et al.

(10) Patent No.: US 12,043,778 B2
(45) Date of Patent: Jul. 23, 2024

(54) METHOD FOR PRODUCING QUANTUM DOT COMPOSITION AND METHOD FOR MANUFACTURING LIGHT EMITTING ELEMENT INCLUDING THE SAME

(71) Applicant: Samsung Display Co., Ltd., Yongin-si (KR)

(72) Inventors: Yunku Jung, Cheonan-si (KR); Yunhyuk Ko, Asan-si (KR); Minki Nam, Incheon (KR); Sooho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 504 days.

(21) Appl. No.: 16/937,088

(22) Filed: Jul. 23, 2020

(65) Prior Publication Data

US 2021/0189233 A1 Jun. 24, 2021

(30) Foreign Application Priority Data

Dec. 20, 2019 (KR) .................. 10-2019-0171704

(51) Int. Cl.
*C09K 11/02* (2006.01)
*B82Y 40/00* (2011.01)
(Continued)

(52) U.S. Cl.
CPC .......... *C09K 11/025* (2013.01); *C09K 11/883* (2013.01); *H10K 50/115* (2023.02);
(Continued)

(58) Field of Classification Search
CPC ..... C09K 11/025; C09K 11/883; C09K 11/02; H10K 50/115; H10K 71/135; H10K 71/00; B82Y 20/00; B82Y 30/00; B82Y 40/00

See application file for complete search history.

(56) References Cited

U.S. PATENT DOCUMENTS 8,247,795 B2  8/2012 Jun et al.
2005/0205851 A1* 9/2005 Sugawara ............. H01F 10/005
                                                  252/514
(Continued)

FOREIGN PATENT DOCUMENTS

KR   10-0722086 B1   5/2007
KR   10-1486529 B1   1/2015
(Continued)

OTHER PUBLICATIONS

Clarke, Mitchell T. et al., "Synthesis of super bright indium phosphide colloidal quantum dots through thermal diffusion", Communications Chemistry, 2019, pp. 1-7, vol. 2, No. 36, Springer Nature Limited.

*Primary Examiner* — Joshua L Schwartz
*Assistant Examiner* — Shawn Shaw Muslim
(74) *Attorney, Agent, or Firm* — Lewis Roca Rothgerber Christie LLP

(57) ABSTRACT

A method for producing a quantum dot composition includes providing a preliminary quantum dot composition containing a quantum dot to which a ligand is bonded and a free ligand, providing an adsorbent to the preliminary quantum dot composition, adsorbing the free ligand to the adsorbent, and removing a modified adsorbent to which the free ligand is adsorbed to provide a purified quantum dot composition. A light emitting element including the purified quantum dot composition may have superior luminous efficiency.

18 Claims, 12 Drawing Sheets

(51) Int. Cl.
  *C09K 11/88* (2006.01)
  *H10K 50/115* (2023.01)
  *B82Y 20/00* (2011.01)
  *B82Y 30/00* (2011.01)
  *H10K 71/13* (2023.01)
(52) U.S. Cl.
  CPC ............... *B82Y 20/00* (2013.01); *B82Y 30/00* (2013.01); *B82Y 40/00* (2013.01); *H10K 71/135* (2023.02)

(56) References Cited

U.S. PATENT DOCUMENTS

| | | | |
|---|---|---|---|
| 2015/0004310 A1 | 1/2015 | Greytak et al. | |
| 2015/0344776 A1* | 12/2015 | Bootman | C09K 11/565 |
| | | | 252/301.36 |
| 2019/0066746 A1* | 2/2019 | Li | G11C 11/161 |
| 2019/0148625 A1* | 5/2019 | Tseng | H10N 50/85 |
| | | | 365/158 |
| 2019/0189928 A1* | 6/2019 | Chung | H10K 50/171 |
| 2020/0176511 A1* | 6/2020 | Park | H10B 61/00 |
| 2021/0163771 A1* | 6/2021 | Haben | C01B 25/08 |
| 2021/0179939 A1* | 6/2021 | Stokes | C07C 213/08 |
| 2021/0273189 A1* | 9/2021 | Imabayashi | H10K 50/115 |
| 2022/0045268 A1* | 2/2022 | Xia | G01R 33/093 |

FOREIGN PATENT DOCUMENTS

| | | |
|---|---|---|
| KR | 10-1486533 B1 | 2/2015 |
| KR | 10-2017-0077944 A | 7/2017 |
| KR | 10-2018-0069687 A | 6/2018 |
| KR | 10-2019-0074211 A | 6/2019 |
| KR | 102048884 B1 * | 11/2019 |

* cited by examiner

METHOD FOR PRODUCING QUANTUM DOT COMPOSITION AND METHOD FOR MANUFACTURING LIGHT EMITTING ELEMENT INCLUDING THE SAME

CROSS-REFERENCE TO RELATED APPLICATION

This application claims priority to and the benefit of Korean Patent Application No. 10-2019-0171704, filed on Dec. 20, 2019, in the Korean Intellectual Property Office, the entire content of which is hereby incorporated by reference.

BACKGROUND

1. Field

The present disclosure herein relates to a method for producing a quantum dot composition and a method for manufacturing a light emitting element including the same.

2. Description of Related Art

Various kinds of display devices utilized in multimedia devices such as televisions, cellular phones, tablet computers, navigations and/or game consoles are being developed. In such display devices, a so-called self-luminescent display element accomplishing display by causing (e.g., exciting) an organic compound-containing light emitting material to emit light is utilized.

In addition, in order to improve color reproducibility of a display device, development of a light emitting element utilizing a quantum dot as a light emitting material is being conducted, and there is a demand for improving luminous efficiency of the light emitting element utilizing a quantum dot.

SUMMARY

One or more aspects of embodiments of the present disclosure are directed toward a method for producing a quantum dot composition including providing an adsorbent to remove a free ligand.

One or more aspects of embodiments of the present disclosure are also directed toward a method for manufacturing a light emitting element provided with a purified quantum dot composition. Additional aspects will be set forth in part in the description which follows and, in part, will be apparent from the description, or may be learned by practice of the presented embodiments of the disclosure.

According to an embodiment of the present disclosure, a method for producing a quantum dot composition includes providing a preliminary quantum dot composition containing a first ligand, a quantum dot bonded to the first ligand, and a free ligand, providing an adsorbent to the preliminary quantum dot composition, adsorbing the free ligand to the adsorbent to produce a modified adsorbent, and removing the modified adsorbent to which the free ligand is adsorbed.

The first ligand and the free ligand each may include a head portion and a chain portion.

The head portion of the free ligand may be bonded to the adsorbent.

The head portion may include a silyl group, a thiol group, or a carboxylic acid group.

The chain portion may include an alkyl group having 3 to 20 carbon atoms.

The adsorbing of the free ligand to the adsorbent may include ultrasonic decomposition or heat treatment.

The removing of the modified adsorbent may include centrifugation.

The adsorbent may include a metal oxide and/or a metal sulfide.

The adsorbent may include Al, Mn, Co, or Zn.

The quantum dot may include a core and a shell surrounding the core.

The adsorbent may be about 50 wt % to about 91 wt % with respect to a total weight of the preliminary quantum dot composition.

The preliminary quantum dot composition may further include an organic solvent.

According to an embodiment of the present disclosure, a method for manufacturing a light emitting element includes forming a first electrode, forming a hole transport region on the first electrode, forming an emission layer including a purified quantum dot composition on the hole transport region, forming an electron transport region on the emission layer, and forming a second electrode on the electron transport region, wherein the forming of the emission layer includes providing the purified quantum dot composition, and the forming of the purified quantum dot composition includes providing a preliminary quantum dot composition containing a first ligand, a quantum dot bonded to the first ligand, and a free ligand, providing an adsorbent to the preliminary quantum dot composition, adsorbing the free ligand to the adsorbent to produce a modified adsorbent, and removing the modified adsorbent to which the free ligand is adsorbed.

The first ligand and the free ligand each may include a head portion and a chain portion.

The head portion of the free ligand may be bonded to the adsorbent.

The head portion may include a silyl group, a thiol group, or a carboxylic acid group.

The chain portion may include an alkyl group having 3 to 20 carbon atoms.

The quantum dot may include a core and a shell surrounding the core.

The providing of the purified quantum dot composition may include inkjet printing.

The purified quantum dot composition may be formed from the preliminary quantum dot composition, and the preliminary quantum dot composition may further include an organic solvent.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
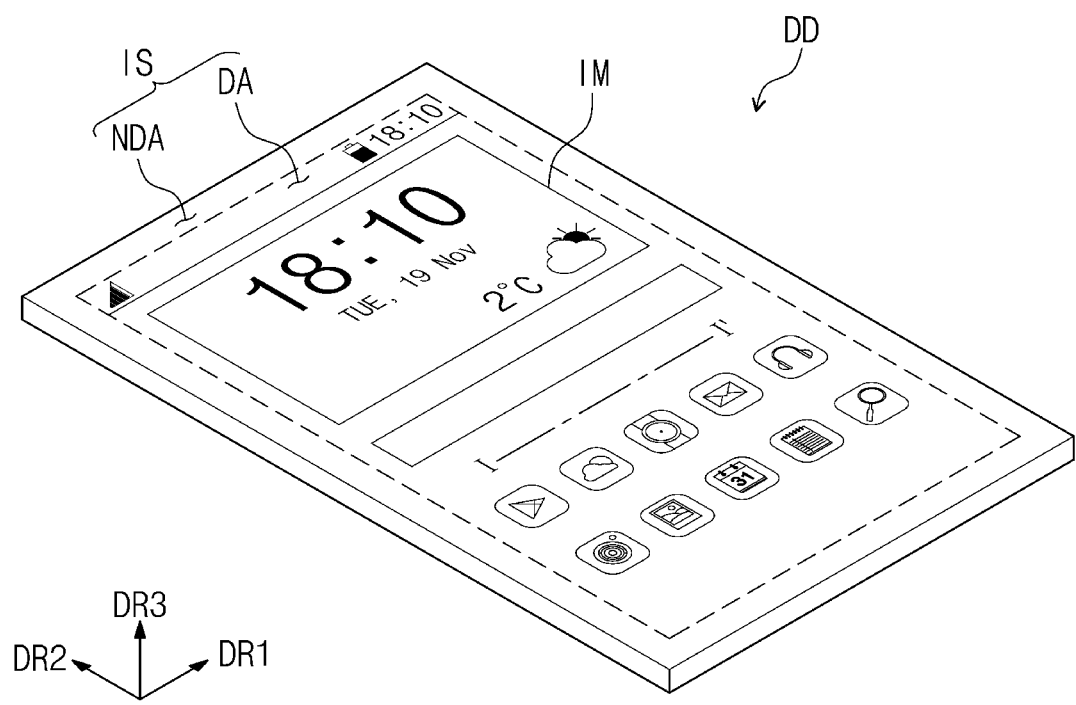
FIG. 1 is a perspective view illustrating a display device according to an embodiment of the present disclosure.

The present disclosure may be modified in many alternate forms, and thus specific embodiments will be exemplified in the drawings and described in more detail. It should be understood, however, that these embodiments are not intended to limit the present disclosure to the particular forms disclosed, but rather, it is intended to cover all modifications, equivalents, and alternatives falling within the spirit and scope of the subject matter of the present disclosure.

In the present disclosure, when an element (or a region, a layer, a portion, etc.) is referred to as being "on," "connected to," or "coupled to" another element, the element may be directly disposed on/connected to/coupled to the other element, or that a third element may be disposed therebetween.

Meanwhile, in the present specification, the term "directly disposed" refers to that there are no intervening layers, films, regions, plates and/or the like. For example, the term "directly disposed" may refer to a member being disposed on another member without any intervening members (such as an adhesive member between two layers or two members).

Like reference numerals refer to like elements. Also, in the drawings, the thickness, the ratio, and the dimensions of elements may be exaggerated for an effective description of technical contents.

The term "and/or," includes any and all combinations of one or more of the associated listed items.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings. In the present specification, it will also be understood that when a part is referred to as being disposed "above" another part, it can be disposed above or beneath the other part.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and unless expressly defined herein, they are not to be interpreted in an ideal or overly formal sense.

It should be understood that the terms "comprise", and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a method for producing a quantum dot composition and a method for manufacturing a light emitting element including the same according to an embodiment of the present disclosure will be described with reference to the accompanying drawings.

Figure 2:
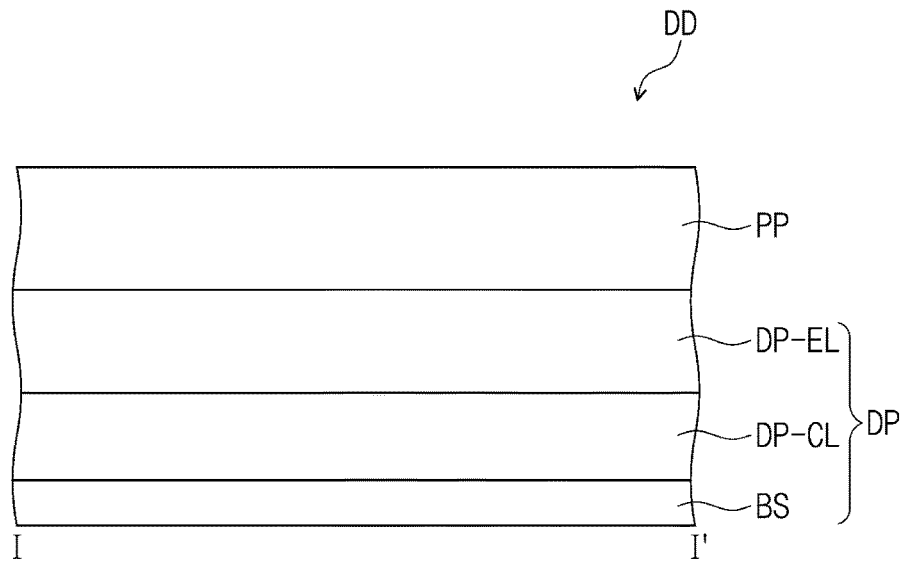
FIG. 2 is a cross-sectional view illustrating a display device corresponding to the line I-I' in FIG. 1 according to an embodiment of the present disclosure.
Figure 3:
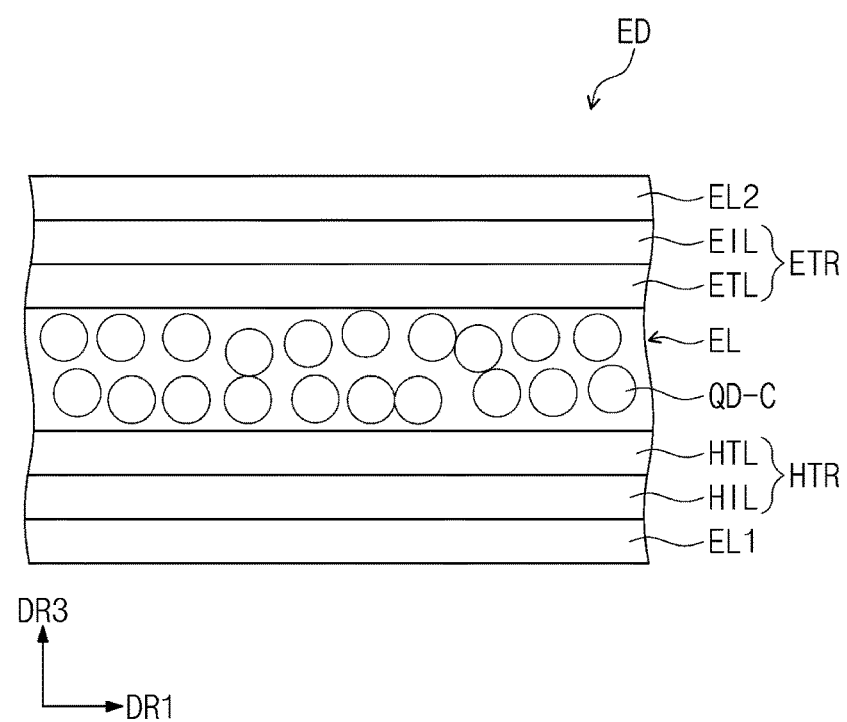
FIG. 3 is a cross-sectional view of a light emitting element according to an embodiment of the present disclosure.

FIG. 1 illustrates a display device DD according to an embodiment. FIG. 2 is a cross-sectional view of a display device DD of an embodiment, corresponding to the line I-I' in FIG. 1. FIG. 3 is a cross-sectional view of a light emitting element ED of an embodiment.

FIG. 1 illustrates an example portable electronic device as a display device DD. The display device DD, however, may be not only utilized for large-sized electronic devices (such as a television set, a monitor, and/or an outdoor billboard), but also utilized for small and medium-sized electronic devices (such as a personal computer, a laptop computer, a personal digital assistant, a car navigation unit, a game console, a smart phone, a tablet, and/or a camera). In addition, these are merely presented as examples, and thus the display device may be adopted for other electronic devices without departing from the scope of the present disclosure.

Referring to FIG. 1, the display device DD may display an image IM through a display surface IS. The display surface IS includes a display area DA in which the image IM is displayed and a non-display area NDA adjacent to the display area DA. The non-display area NDA is an area where no image is displayed.

The display area DA may be in a rectangular shape. The non-display area NDA may surround the display area DA. However, the present disclosure is not limited thereto, and the shape of the display area DA and the non-display area NDA may be relatively designed. In addition, the non-display area NDA may not exist on a front surface of the display device DD.

The display device DD according to an embodiment may include a display panel DP and a light control layer PP disposed on the display panel DP. The display panel DP may include a display element layer DP-EL. The display element layer DP-EL includes a light emitting element ED. The display device DD may include a plurality of light emitting elements. The light control layer PP may be disposed on the display panel DP to control reflected light from the display panel DP due to external light. The light control layer PP may include, for example, a polarization layer and/or a color filter layer.

In the display device DD of an embodiment, the display panel DP may be a light emitting display panel. For example, the display panel DP may be a quantum dot light emitting display panel including a quantum dot light emitting element. However, the present disclosure is not limited thereto.

The display panel DP may include a base substrate BS, a circuit layer DP-CL disposed on the base substrate BS, and a display element layer DP-EL disposed on the circuit layer DP-CL.

The base substrate BS may be a member that provides a base surface where the display element layer DP-EL is disposed. The base substrate BS may be a glass substrate, a metal substrate, a plastic substrate, etc. However, the present disclosure is not limited thereto, and the base substrate BS may be an inorganic layer, an organic layer or a composite material layer. The base substrate BS may be a flexible substrate that may be easily bent or folded.

In an embodiment, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor to drive the light emitting element ED of the display element layer DP-EL.

FIG. 3 is a cross-sectional view illustrating a light emitting element ED according to an embodiment. Referring to FIG. 3, the light emitting element ED according to an embodiment includes a first electrode EL1, a second electrode EL2 facing the first electrode EL1, and a plurality of functional layers disposed between the first electrode EL1 and the second electrode EL2 and including an emission layer EL.

The plurality of functional layers may include a hole transport region HTR disposed between the first electrode EL1 and the emission layer EL and an electron transport region ETR disposed between the emission layer EL and the second electrode EL2. In an embodiment, a capping layer may be further disposed on the second electrode EL2.

The hole transport region HTR and the electron transport region ETR each may include at least one sub-functional layer. For example, the hole transport region HTR may include a hole injection layer HIL and/or a hole transport layer HTL as a sub-functional layer, and the electron transport region ETR may include an electron injection layer EIL and/or an electron transport layer ETL as a sub-functional layer.

The hole transport region HTR may be formed of one functional layer, for example, the hole transport region HTR may include either a hole injection layer HIL or a hole transport layer HTL. In addition, the electron transport region ETR may be formed of one functional layer, for example, the electron transport region ETR may include either an electron injection layer EIL or an electron transport layer ETL. However, the present disclosure is not limited thereto, and the hole transport region HTR may further include an electron blocking layer as a sub-functional layer, and the electron transport region ETR may further include a hole blocking layer as a sub-functional layer.

In the light emitting element ED according to an embodiment, the first electrode EL1 has conductivity. The first electrode EL1 may be formed of a metal alloy or a conductive compound. In one embodiment, the first electrode EL1 may be an anode. In one embodiment, the first electrode EL1 may be a pixel electrode.

In the light emitting element ED according to an embodiment, the first electrode EL1 may be a reflective electrode. However, the present disclosure is not limited thereto. For example, the first electrode EL1 may be a transmissive electrode, or a transflective electrode. When the first electrode EL1 is the transflective electrode or the reflective electrode, the first electrode EL1 may include silver (Ag), magnesium (Mg), copper (Cu), aluminum (Al), platinum (Pt), palladium (Pd), gold (Au), nickel (Ni), niobium (Nb), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In one embodiment, the first electrode EL1 may have a multilayer structure including a reflective film or a transflective film, and a transparent conductive film formed of indium tin oxide (ITO), indium zinc oxide (IZO), zinc oxide (ZnO), indium tin zinc oxide (ITZO), etc. For example, the first electrode EL1 may be a multilayer film, and may have a laminated structure of ITO/Ag/ITO.

The hole transport region HTR is provided on the first electrode EL1. The hole transport region HTR may include a hole injection layer HIL, a hole transport layer HTL, etc. In addition, the hole transport region HTR may further include a hole buffer layer and/or an electron blocking layer EBL in addition to the hole injection layer HIL and the hole transport layer HTL. The hole buffer layer may compensate a resonance distance according to the wavelength of light emitted from an emission layer EL and may increase light emission efficiency. Materials which may be included in the hole transport region HTR may be utilized as materials included in the hole buffer layer. The electron blocking layer is a layer that serves to prevent or substantially prevent electrons from being injected from the electron transport region ETR to the hole transport region HTR.

The hole transport region HTR may have a single layer formed of a single material, a single layer formed of a plurality of different materials, or a multilayer structure including a plurality of layers formed of a plurality of different materials.

For example, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, a hole buffer layer/hole transport layer HTL, a hole injection layer HIL/hole transport layer HTL/electron blocking layer, or a hole buffer layer/hole injection layer HIL/hole transport layer HTL are stacked in the stated order from the first electrode EL1, but the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole derivatives (such as N-phenyl carbazole and/or polyvinyl carbazole), fluorine derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The emission layer EL is provided on the hole transport region HTR. The emission layer EL according to an embodiment may include a quantum dot composition QCP (FIG. 9) from which a free ligand FR (FIG. 6) is removed. The quantum dot composition QCP may include a quantum dot composite QD-C. The quantum dot composite QD-C may be the one in which a ligand (e.g., a first ligand) LD is bonded to a quantum dot QD and the free ligand FR (FIG. 6) may be a ligand that is not bonded to the surface of the quantum dot QD. The free ligand FR (FIG. 6) may include the configuration of the ligand LD. That is, the free ligand FR may have the same structure as the ligand LD, and/or may be the same material as the ligand LD. For example, in a quantum dot QD and ligand mixture, only a portion of the ligand (e.g., referred to as the first ligand) is bonded to the surface of the quantum dot QD to form the quantum dot composite QD-C. The portion of the ligand that is not bonded to the surface of the quantum dot QD is referred to as the free ligand FR. The free ligand FR is at least partially removed when forming the quantum dot composition QCP.

Figure 5:
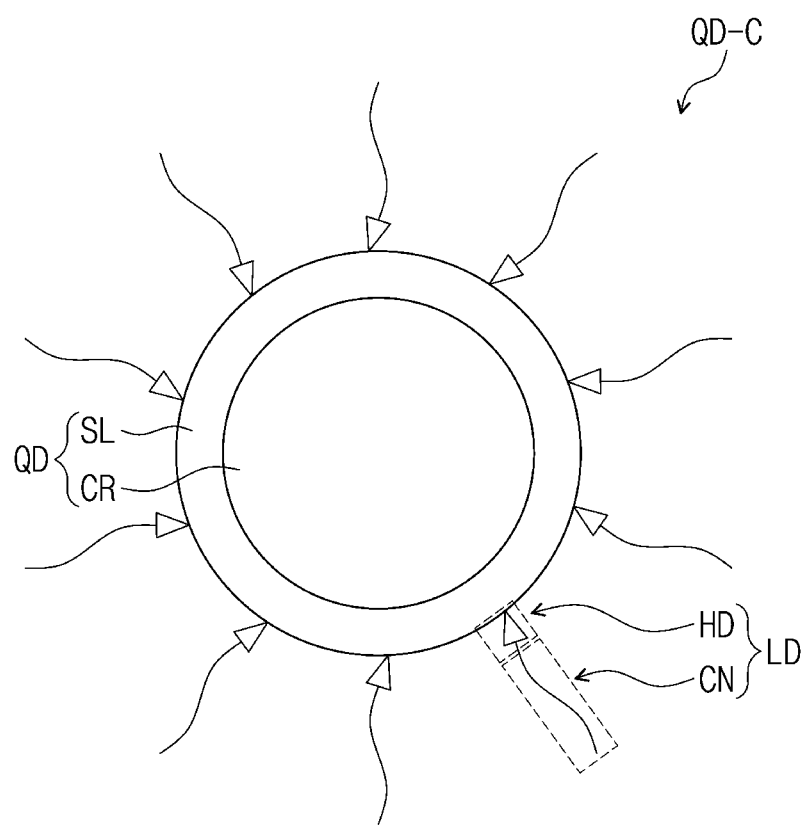
FIG. 5 is a cross-sectional view illustrating a quantum dot and a ligand according to an embodiment of the present disclosure.

In FIG. 5, the quantum dot complex QD-C is schematically illustrated, and the quantum dot complex QD-C will be described in more detail with reference to FIG. 5.

The quantum dot QD according to an embodiment may be a semiconductor nanocrystal that may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from silicon (Si), germanium (Ge), and a mixture thereof. The Group IV compound may be a binary compound selected from the group consisting of SiC, SiGe, and a mixture thereof.

In one embodiment, a binary compound, a ternary compound, or a quaternary compound may be present in a particle with a uniform concentration distribution, or a non-uniform concentration distribution (e.g., may be present with a partially different concentration in the same particle). In addition, a quantum dot may have a core/shell structure in which one quantum dot surrounds another quantum dot. An interface between a core and a shell may have a concentration gradient in which the concentration of an element present in the shell becomes lower toward the center (e.g., of the core).

In some embodiments, a quantum dot may have a core-shell structure including a core having nano-crystals and a shell surrounding the core which are described above. The shell of the quantum dot QD having a core-shell structure may serve as a protection layer to reduce or prevent the chemical deformation of the core so as to maintain semiconductor properties, and/or as a charging layer to impart electrophoresis properties to the quantum dot. The shell may be a single layer or multiple layers. An interface between the core and the shell may have a concentration gradient in which the concentration of an element present in the shell becomes lower toward the center (e.g., of the core). An example of the shell of the quantum dot QD having a core-shell structure may be a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, or a ternary compound such as $MgAl_2O_4$, $CoFe_2O_4$, $NiFe_2O_4$, and/or $CoMn_2O_4$, but the present disclosure is not limited thereto. Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

A quantum dot QD may have a full width of half maximum (FWHM) of a light emission wavelength spectrum of about 45 nm or less, in one embodiment about 40 nm or less, in another embodiment about 30 nm or less. When the full width of half maximum (FWHM) of the light emission wavelength spectrum satisfies the above ranges, color purity or color reproducibility may be improved. In addition, light emitted through such quantum dot is emitted in all directions so that a wide viewing angle may be improved.

In addition, although the form of a quantum dot QD is not particularly limited as long as it is a form commonly utilized in the related art, in one embodiment, a quantum dot in the form of spherical, pyramidal, multi-arm, or cubic nanoparticles, nanotubes, nanowires, nanofibers, nanoparticles, etc., may be utilized.

A quantum dot QD may control the color of emitted light according to the particle size thereof and thus quantum dots QD may have various light emission colors such as blue, red, green, etc. When the particle size of the quantum dot QD becomes smaller, light in the shorter wavelength region may be emitted. For example, in the quantum dots QD having the same core, the particle size of a quantum dot emitting green light may be smaller than the particle size of a quantum dot emitting red light. In addition, in the quantum dots QD having the same core, the particle size of a quantum dot emitting blue light may be smaller than the particle size of a quantum dot emitting green light. However, the present disclosure is not limited thereto, and even in the quantum dots QD having the same core, the particle size may be adjusted according to the forming-material and thickness of the shell.

In one embodiment, for a plurality of quantum dots QD having various suitable emission colors such as blue, red, green, etc., the quantum dots QD having a different emission color may have a different core material.

In addition, in the light emitting element ED of an embodiment, an emission layer EL may include a host and a dopant. In an embodiment, the emission layer EL may include a quantum dot (e.g., a plurality of quantum dots) QD as a dopant material. Also, in an embodiment, the emission layer EL may further include a host material.

In the light emitting element ED of an embodiment, an emission layer EL may emit fluorescence. For example, a quantum dot (e.g., a plurality of quantum dots) QD may be utilized as a fluorescence dopant material.

The emission later EL may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

In the light emitting element ED of an embodiment, an electron transport region ETR is provided on the emission layer EL. The electron transport region ETR may include a hole blocking layer, an electron transport layer ETL, and/or an electron injection layer EIL, but the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL and a hole blocking layer/electron transport layer ETL/electron injection layer EIL are stacked in the stated order from the emission layer EL, but the present disclosure is not limited thereto. The thickness of the electron transport region ETR may be, for example, from about 200 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl)-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato) aluminum (BAlq), berylliumbis(benzoquinolin-10-olate) ($Bebq_2$), 9,10-di(naphthalene-2-yl)anthracene (ADN), or a mixture thereof. The thickness of the electron transport layer ETL may be from about 100 Å to about 1,000 Å and may be, for example, from about 150 Å to about 500 Å. When the thickness of the electron transport layers ETL satisfies the above-described ranges, satisfactory electron transport properties may be obtained without a substantial increase in driving voltage.

When the electron transport region ETR includes the electron injection layer EIL, the electron transport region ETR may include a halogenated metal, a lanthanide metal, or a co-deposited material of a halogenated metal and a lanthanide metal. In one embodiment, the halogenated metal may be an alkali metal halide. For example, the electron transport region ETR may include LiF, lithium quinolate (Liq), $Li_2O$, BaO, NaCl, CsF, Yb, RbCl, RbI, KI, and/or KI: Yb, but the present disclosure is not limited thereto. The electron injection layer EIL may also be formed of a mixture material of an electron transport material and an insulating organo-metal salt. The organo-metal salt may include, for example, metal acetates, metal benzoates, metal acetoacetates, metal acetylacetonates, and/or metal stearates. The thickness of the electron injection layers EIL may be from about 1 Å to about 100 Å, or from about 3 Å to about 90 Å. When the thickness of the electron injection layers EIL satisfies the above-described ranges, satisfactory electron injection properties may be obtained without a substantial increase in driving voltage.

The electron transport region ETR may include a hole blocking layer as described above. The hole blocking layer may include, for example, 2,9-dimethyl-4,7-diphenyl-1,10-phenanthroline (BCP) and/or 4,7-diphenyl-1,10-phenanthroline (Bphen), but the present disclosure is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may include a transparent metal oxide, for example, indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In one embodiment, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), and/or indium tin zinc oxide (ITZO).

In one embodiment, the second electrode EL2 may be connected with an auxiliary electrode. When the second electrode EL2 is connected with the auxiliary electrode, the resistance of the second electrode EL2 may decrease.

Figure 4:
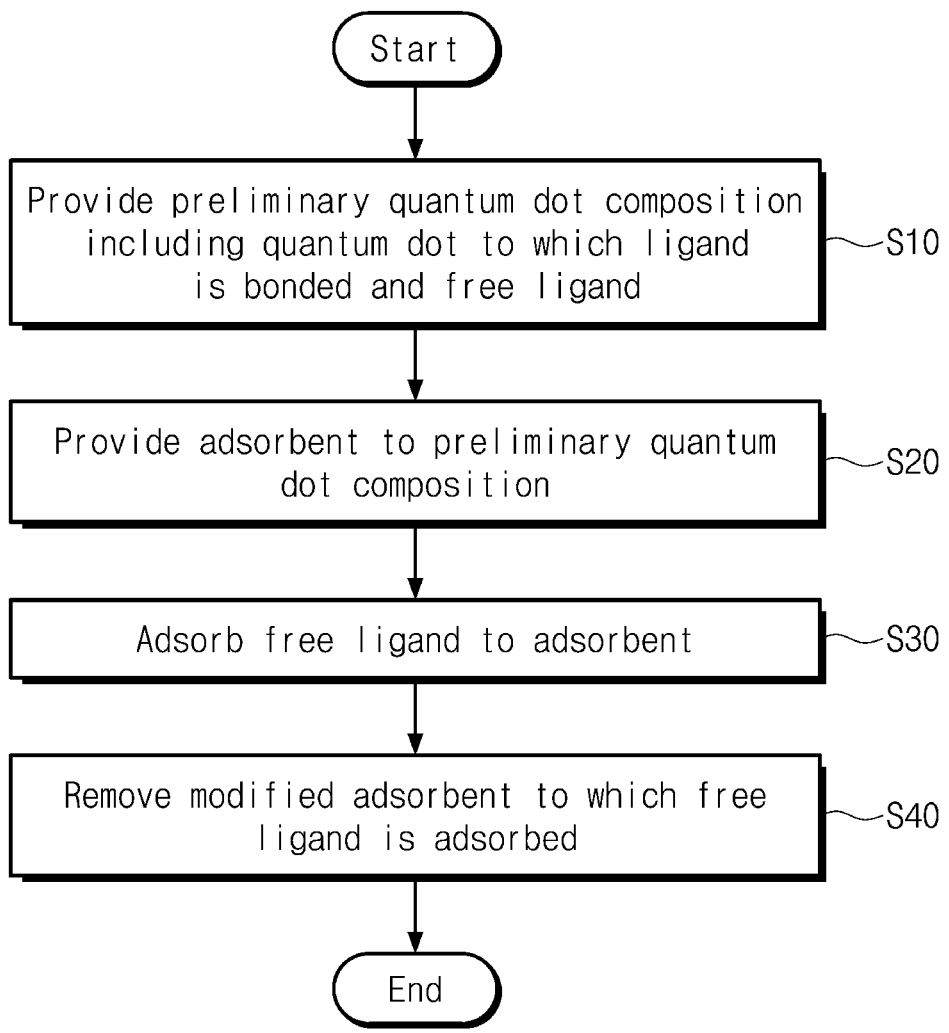
FIG. 4 is a flowchart illustrating a method for producing a quantum dot composition according to an embodiment of the present disclosure.

FIG. 4 is a flowchart illustrating a method for producing a quantum dot composition QCP according to an embodiment. FIG. 5 illustrates a quantum dot composite QD-C according to an embodiment. FIGS. 6-9 are views sequentially illustrating a method for producing a quantum dot composition QCP of an embodiment shown in FIG. 4.

A method for producing a quantum dot composition QCP according to an embodiment may include providing a preliminary quantum dot composition QCP-P containing a quantum dot QD to which a ligand (e.g., a first ligand) LD is bonded and a free ligand FR (S10), providing an adsorbent AD to the preliminary quantum dot composition QCP-P (S20), adsorbing the free ligand FR to the adsorbent AD (S30), and removing a modified adsorbent AD-a to which the free ligand FR is adsorbed (S40).

The quantum dot composite QD-C according to an embodiment may be included in a quantum dot composition QCP and a preliminary quantum dot composition QCP-P (FIG. 6) that will be described in more detail later. The quantum dot complex QD-C according to an embodiment may be the one in which a ligand LD is bonded to a quantum dot QD.

Referring to FIG. 5, the quantum dot QD may include a core CR and a shell SL surrounding the core CR. However, the present disclosure is not limited thereto, and the quantum dot QD may have a single layer structure or may have one or more (e.g., a plurality of) shells. The same description on the quantum dot composite QD-C described in the light emitting element ED of an embodiment described with reference to FIG. 3 may be applied to the quantum dot composite QD-C included in the quantum dot composition QCP of an embodiment.

The ligand LD may include a head portion HD bonded to a surface of the quantum dot QD and a chain portion CN bonded to the head portion HD. The ligand LD may include the head portion HD bonded to the surface of the quantum dot QD and the chain portion CN exposed to the outside.

According to an embodiment, the head portion HD may include any one selected from a silyl group, a thiol group, a carboxylic acid group, a silane group, an alcohol group, and an amine group, and the chain portion CN may include an alkyl group having 3 to 20 carbon atoms. However, the present disclosure is not limited thereto.

Figure 6:
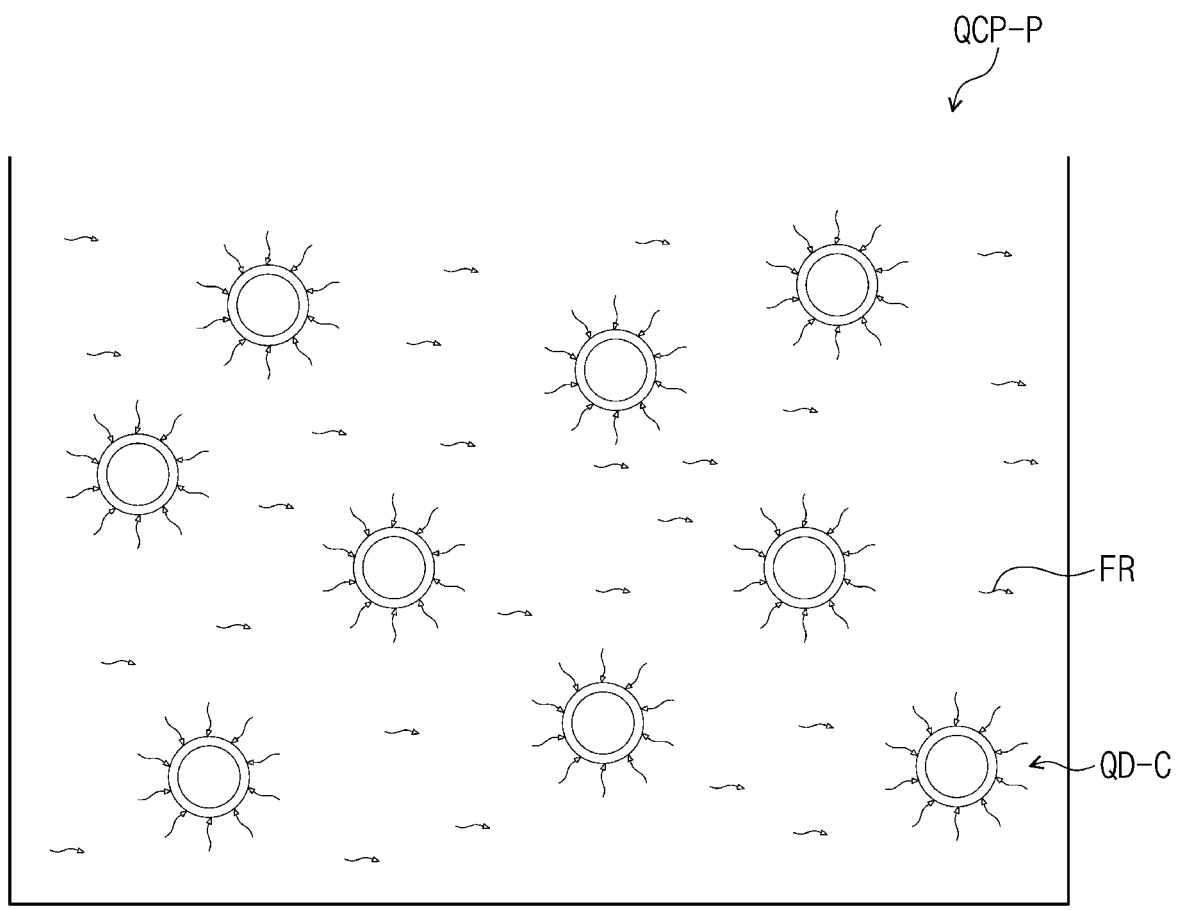
FIG. 6 is a cross-sectional view illustrating a part of a method for producing a quantum dot composition according to an embodiment of the present disclosure.
Figure 7:
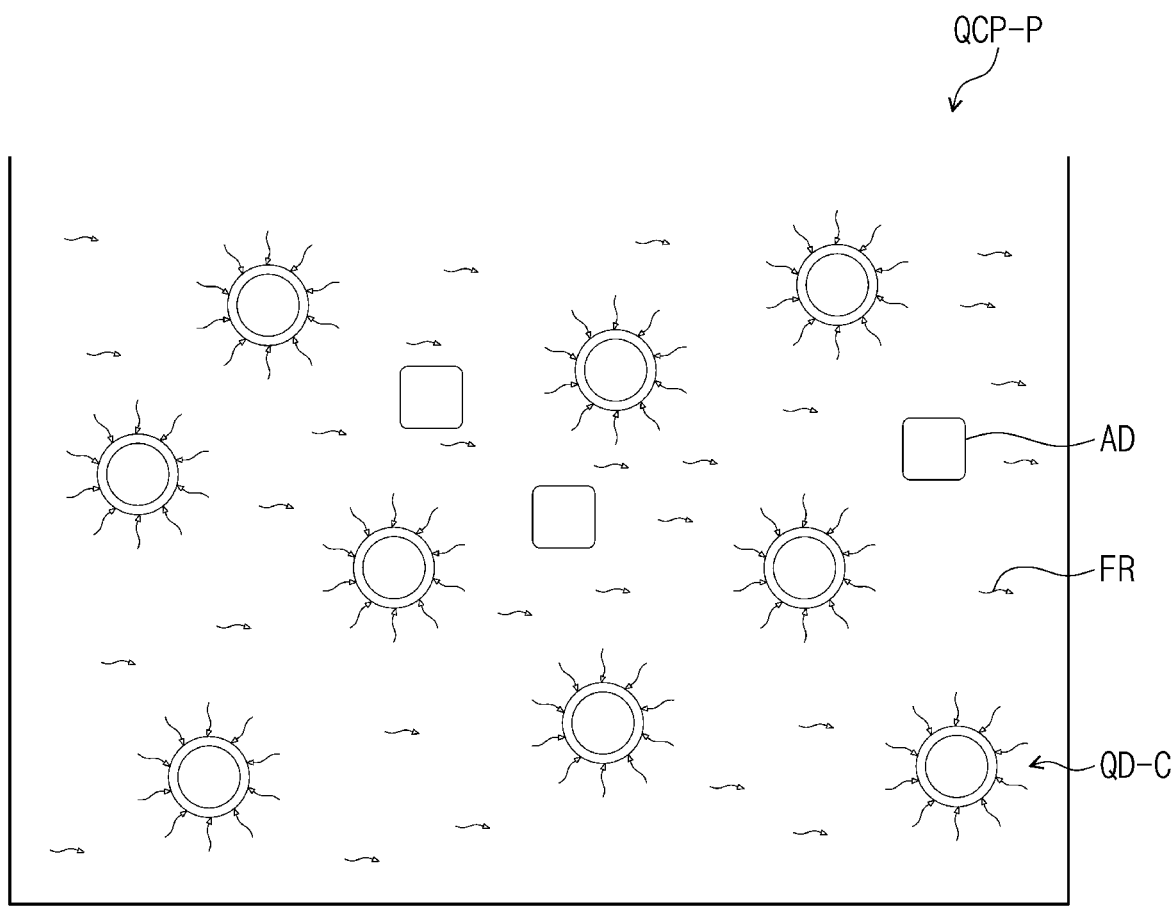
FIG. 7 is a cross-sectional view illustrating a part of a method for producing a quantum dot composition according to an embodiment of the present disclosure.
Figure 8:
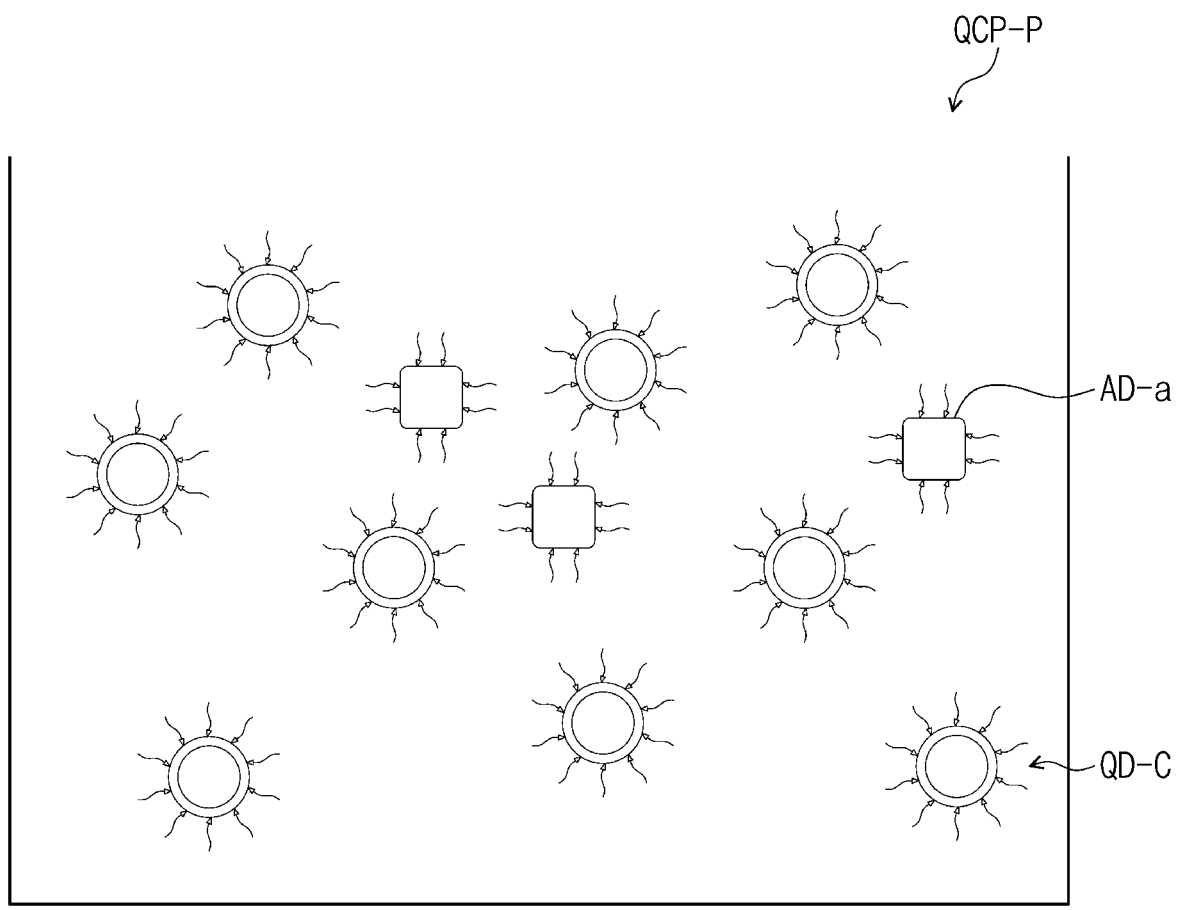
FIG. 8 is a cross-sectional view illustrating a part of a method for producing a quantum dot composition according to an embodiment of the present disclosure.
Figure 9:
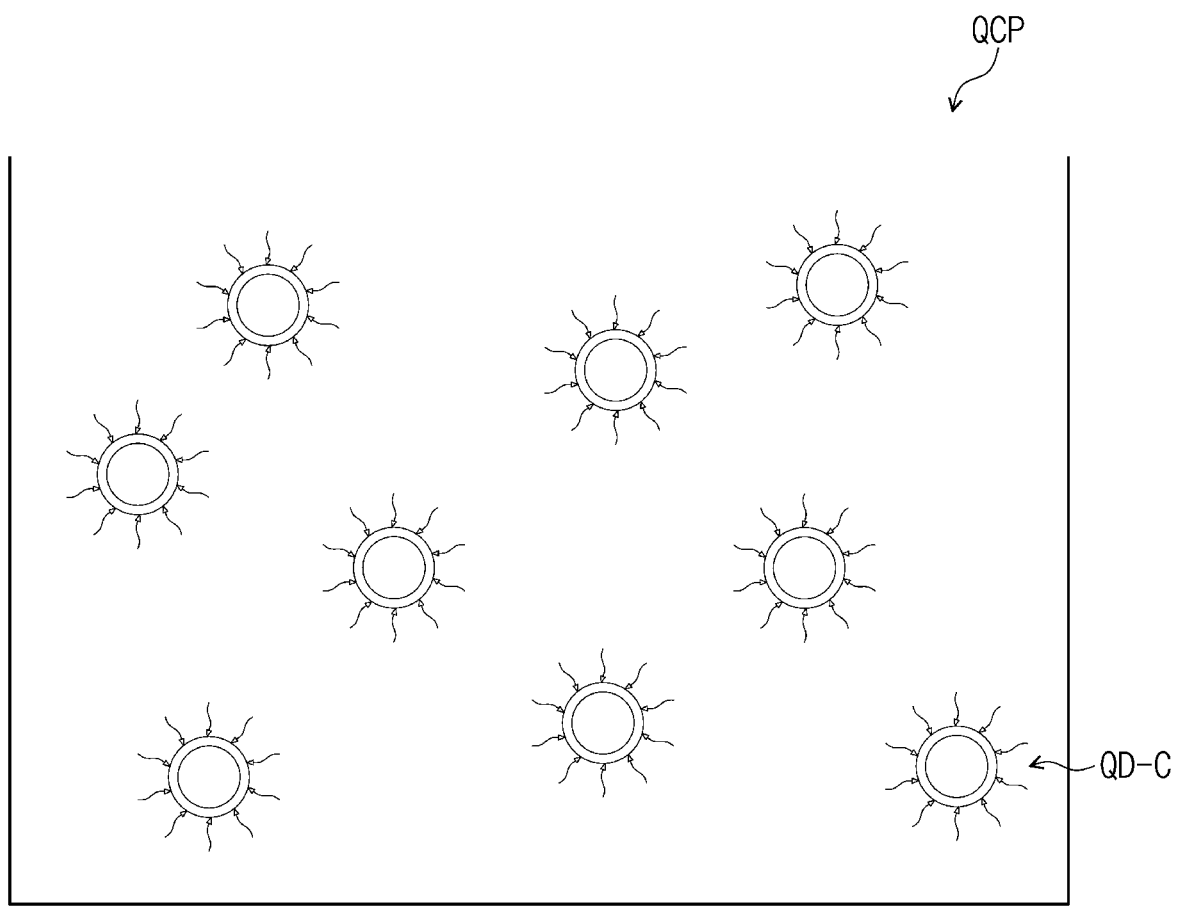
FIG. 9 is a cross-sectional view illustrating a part of a method for producing a quantum dot composition according to an embodiment of the present disclosure.

FIG. 6 is a view schematically illustrating the act of providing the preliminary quantum dot composition QCP-P including the quantum dot composite QD-C and the free ligand FR shown in FIG. 4 (S10). FIG. 7 is a view schematically illustrating the act of providing the adsorbent AD to the preliminary quantum dot composition QCP-P shown in FIG. 4 (S20). FIG. 8 is a view schematically illustrating the act of adsorbing the free ligand FR to the adsorbent AD shown in FIG. 4 (S30). FIG. 9 is a view schematically illustrating the act of removing the modified adsorbent AD-a to which the free ligand FR is adsorbed shown in FIG. 4 (S40).

In an embodiment, the preliminary quantum dot composition QCP-P may include the quantum dot (e.g., a plurality of quantum dots) QD to which the ligand LD is bonded and the free ligand FR. That is, the preliminary quantum dot composition QCP-P may include the quantum dot composite QD-C and the free ligand FR. In one embodiment, the preliminary quantum dot composition QCP-P may further include an organic solvent. For example, the organic solvent may include hexane, toluene, chloroform, dimethyl sulfoxide, dimethyl formamide, etc. However, the present disclosure is not limited thereto.

According to an embodiment, an adsorbent AD may be provided to the preliminary quantum dot composition QCP-P. The adsorbent AD may be a metal oxide and/or a metal sulfide. However, the present disclosure is not limited thereto.

The adsorbent AD in the preliminary quantum dot composition QCP-P may be about 50 wt % to about 91 wt %. That is, the content of the adsorbent AD with respect to 100 wt % of the preliminary quantum dot composition QCP-P may be about 50 wt % to about 91 wt %. For example, the content of the adsorbent AD may be the same as the content of the quantum dot composite QD-C.

The free ligand FR included in the preliminary quantum dot composition QCP-P may be removed utilizing the adsorbent AD. The free ligand FR may be bonded to the adsorbent AD. The head portion HD of the free ligand FR may be bonded to the adsorbent AD. Affinity, which is a degree of binding to the adsorbent AD, may vary depending on the kind (e.g., chemical species) of the head portion HD of the free ligand FR. For example, when the head portion HD is a thiol group, the adsorbent AD may be aluminum (Al). However, the present disclosure is not limited thereto.

Non-limiting examples of the adsorbent may include a binary compound selected from the group consisting of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, CdS, CdSe, CdTe, ZnS, ZnSe, ZnTe, GaAs, GaP, GaSb, HgS, and HgSe or a ternary compound selected from the group consisting of $MgAl_2O_4$, $CoFe_2O_4$, $NiFe_2O_4$, $CoMn_2O_4$, ZnSeS, ZnTeS, and InGaP, but the present disclosure is not limited thereto.

In one embodiment, a method for producing a quantum dot composition QCP of an embodiment may further include ultrasonic decomposition or heat treatment after the free ligand FR is adsorbed to the adsorbent AD. When the ultrasonic decomposition or heat treatment is performed, affinity (e.g., between the free ligand FR and the adsorbent AD) may increase. When the affinity increases, the number of the free ligand FR bonded to the adsorbent AD may increase.

FIG. 8 illustrates a modified adsorbent AD-a to which the free ligand FR is adsorbed. The removing of the modified adsorbent AD-a may include centrifugation. The centrifugation may remove the modified adsorbent AD-a and obtain a purified quantum dot composition QCP as shown in FIG. 9. The quantum dot composition QCP may be manufactured from a preliminary quantum dot composition QCP-P.

Though FIGS. 8 and 9 illustrate that all of the free ligand FR is adsorbed, in one embodiment, a small amount of the free ligand may be left unremoved.

Figure 10:
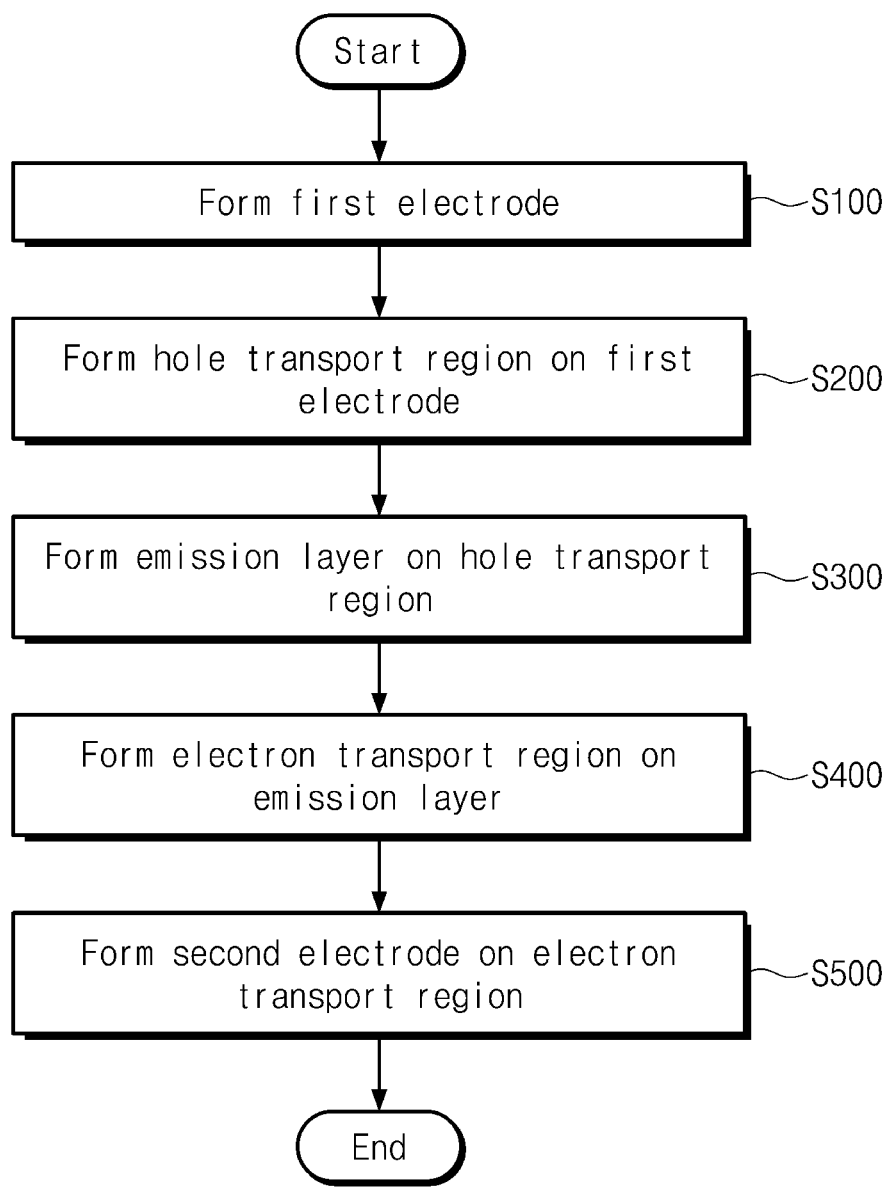
FIG. 10 is a flowchart illustrating a method for manufacturing a light emitting element according to an embodiment of the present disclosure.
Figure 11:
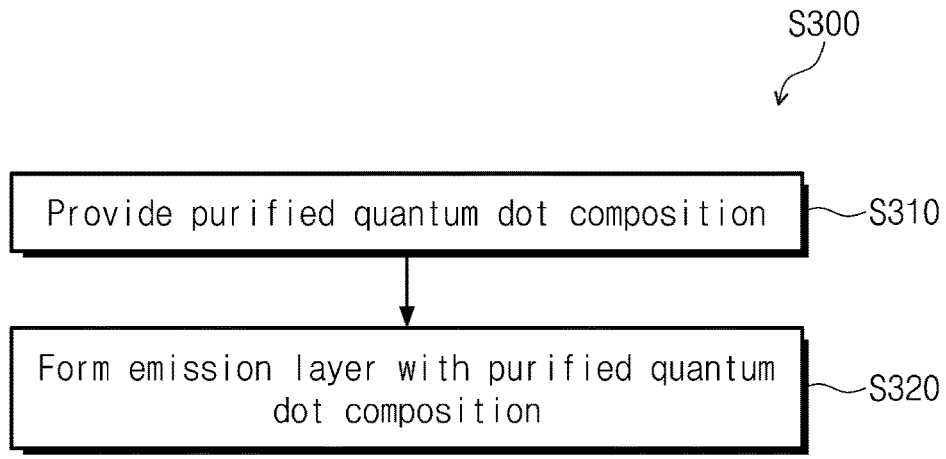
FIG. 11 is a flowchart illustrating a part of a method for manufacturing a light emitting element according to an embodiment of the present disclosure.
Figure 12:
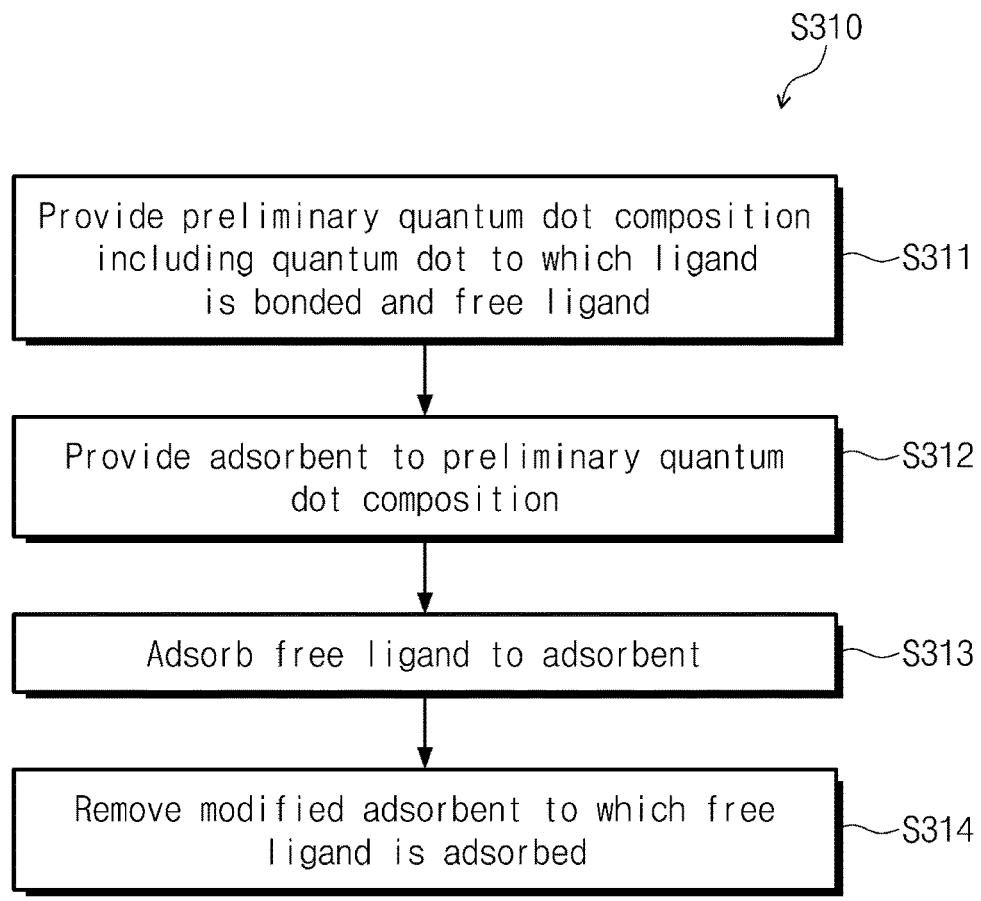
FIG. 12 is a flowchart illustrating a part of a method for manufacturing a light emitting element according to an embodiment of the present disclosure.

FIG. 10 is a flowchart illustrating a method for manufacturing a light emitting element ED of an embodiment. FIG. 11 is a flowchart illustrating a part of a method for manufacturing the light emitting element ED of an embodiment shown in FIG. 10. FIG. 12 is a flowchart illustrating a part of a method for manufacturing the light emitting element ED of an embodiment shown in FIG. 11.

A method for manufacturing a light emitting element ED of an embodiment may include forming a first electrode EL1 (S100), forming a hole transport region HTR on the first electrode EL1 (S200), forming an emission layer EL on the hole transport region HTR (S300), forming an electron transport region ETR on the emission layer EL (S400), and forming a second electrode EL2 (S500) on the electron transport region ETR.

According to an embodiment, the forming of the emission layer EL (S300) may include providing a purified quantum dot composition QCP (S310) and forming an emission layer EL with the purified quantum dot composition QCP (S320).

The forming of the emission layer EL (S300) may include inkjet printing, but the present disclosure is not limited thereto. In addition, the same description on the first electrode EL1, the hole transport region HTR, the electron transport region ETR, and the second electrode EL2 with reference to FIG. 3 may be applied to forming the first electrode EL1 (S100), forming the hole transport region HTR (S200), forming the electron transport region ETR (S400), and forming the second electrode EL2 (S500).

The providing of a purified quantum dot composition QCP of an embodiment (S310) may include providing a preliminary quantum dot composition QCP-P containing a quantum dot QD to which a ligand LD is bonded and a free ligand FR (S311), providing an adsorbent AD to the preliminary quantum dot composition QCP-P (S312), adsorbing the free ligand FR to the adsorbent AD (S313), and removing a modified adsorbent AD-a to which the free ligand is adsorbed (S314).

The purified quantum dot composition QCP is obtained from the preliminary quantum dot composition QCP-P, and thus the providing of the purified quantum dot composition QCP (S310) may include the method for producing the quantum dot composition QCP of an embodiment, and the description on the method for producing the quantum dot composition QCP described above may be applied.

Figure 13:
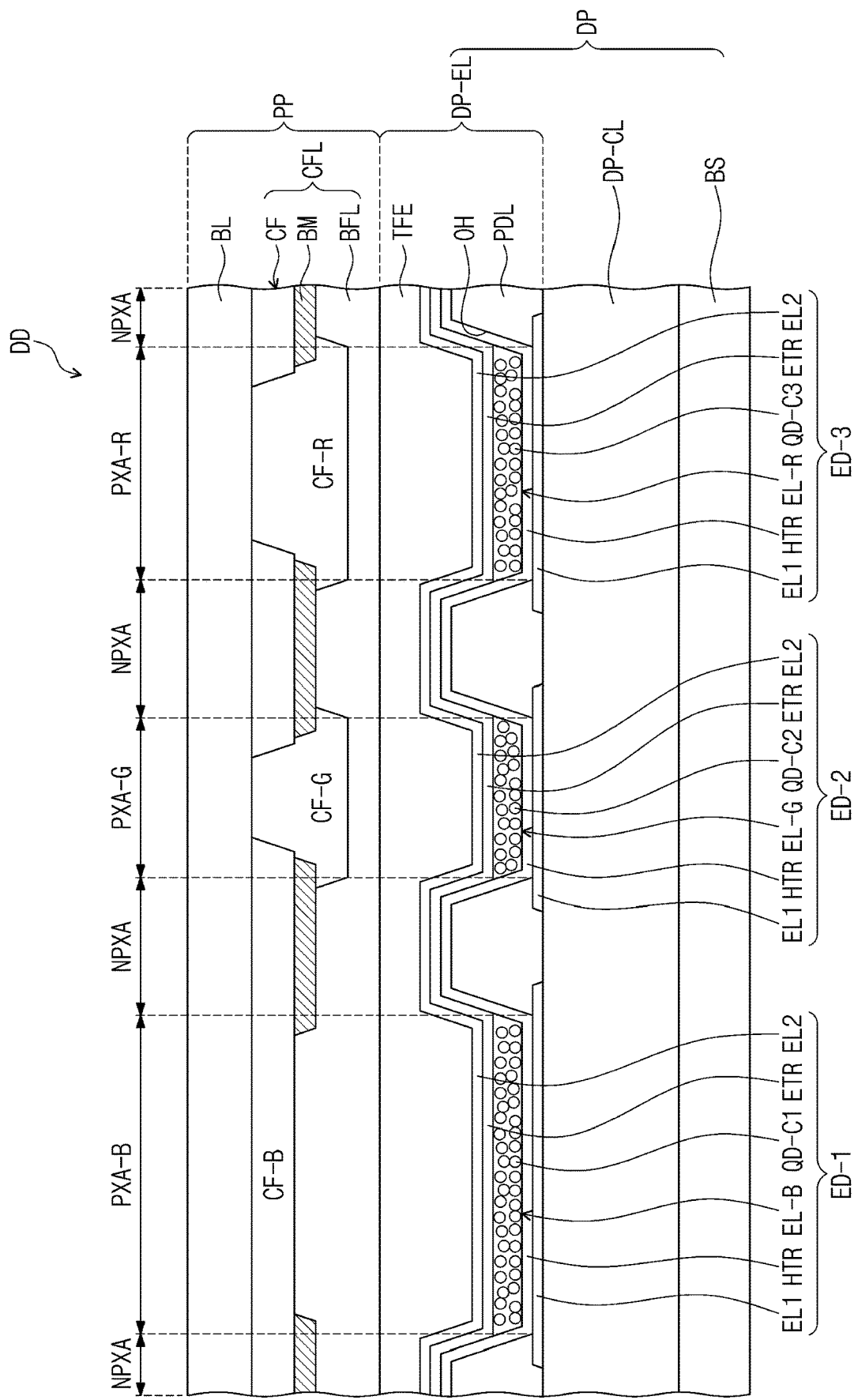
FIG. 13 is a cross-sectional view of a display device DD according to an embodiment of the present disclosure.

FIG. 13 is a cross-sectional view of a display device DD according to an embodiment, and may illustrate the configuration shown in FIG. 2 in more detail.

The display device DD of an embodiment may include a plurality of light emitting elements ED-1, ED-2, and ED-3, and the light emitting elements ED-1, ED-2, and ED-3 may include emission layers EL-B, EL-G, and EL-R having quantum dot composites QD-C1, QD-C2, and QD-C3 respectively.

In addition, the display device DD of an embodiment may include a display panel DP containing the plurality of light emitting elements ED-1, ED-2 and ED-3, and a light control layer PP disposed on the display panel DP. In one embodiment, unlike the view shown, the light control layer PP may be omitted from the display device DD of an embodiment.

The display panel DP may include a base substrate BS, a circuit layer DP-CL and a display element layer DP-EL provided on the base substrate BS, and the display element layer DP-EL may include a pixel defining film PDL, light emitting elements ED-1, ED-2 and ED-3 disposed between the pixel defining film PDL, and an encapsulation layer TFE disposed on the light emitting elements ED-1, ED-2 and ED-3.

Referring to FIG. 13, the display device DD may include a non-light emitting area NPXA and light emitting areas PXA-B, PXA-G and PXA-R. Each of the light emitting areas PXA-B, PXA-G and PXA-R may be an area emitting light generated from each of the light emitting elements ED-1, ED-2 and ED-3.

The light emitting areas PXA-B, PXA-G and PXA-R may be divided into a plurality of groups according to the color of light generated from the light emitting elements ED-1, ED-2 and ED-3. In the display device DD of an embodiment illustrated in FIG. 16, three light emitting areas PXA-B, PXA-G and PXA-R which emit blue light, green light, and red light respectively are exemplarily illustrated. For example, the display device DD of an embodiment may include a blue emission area PXA-B, a green emission area PXA-G and a red emission area PXA-R, which are distinguished from each other.

The plurality of light emitting elements ED-1, ED-2 and ED-3 may emit light in different wavelength regions. For example, in an embodiment, the display device DD may include a first light emitting element ED-1 emitting blue light, a second light emitting element ED-2 emitting green light, and a third light emitting element ED-3 emitting red light. However, the present disclosure is not limited thereto, and the first to third light emitting elements ED-1, ED-2 and ED-3 may emit light in the same wavelength region or emit light in at least two different wavelength regions.

For example, the blue emission area PXA-B, the green emission area PXA-G, and the red emission area PXA-R of the display device DD may correspond to the first light emitting element ED-1, the second light emitting element ED-2, and the third light emitting element ED-3, respectively.

The first emission layer EL-B of the first light emitting element ED-1 may include a first quantum dot composite QD-C1. The first quantum dot composite QD-C1 may emit blue light, which is a first color light.

The second emission layer EL-G of the second light emitting element ED-2 and the third emission layer EL-R of the third light emitting element ED-3 may include a second quantum dot composite QD-C2 and a third quantum dot composite QD-C3, respectively. The second quantum dot composite QD-C2 and the third quantum dot composite QD-C3 may emit green light, which is a second color light and red light, which is a third color light, respectively.

Although schematically shown in FIG. 13, the first to third quantum dot composites QD-C1, QD-C2, and QD-C3 may each include a quantum dot QD (FIG. 5) and a ligand LD (FIG. 5). In addition, for the first to third quantum dot composites QD-C1, QD-C2, and QD-C3, the description on the quantum dot QD (FIG. 5) and ligand LD (FIG. 5) described above respectively may be applied.

Each of the first to third emission layers EL-B, EL-G, and EL-R including each of the respective first to third quantum dot composites QD-C1, QD-C2, and QD-C3 may be each derived from a respective purified quantum dot composition.

In an embodiment, the first to third quantum dot composite QD-C1, QD-C2, and QD-C3 included in the light emitting elements ED-1, ED-2, and ED-3 are formed of different core materials. In one embodiment, the first to third quantum dot composites QD-C1, QD-C2, and QD-C3 may be formed of the same core material, or two quantum dots selected from the first to third quantum dot composites QD-C1, QD-C2, and QD-C3 may be formed of the same core material and the rest may be formed of different core materials.

Each of the light emitting areas PXA-B, PXA-G and PXA-R may be an area separated by a pixel defining film PDL. The non-light emitting areas NPXA may be areas between neighboring light emitting areas PXA-B, PXA-G and PXA-R and may correspond to the pixel defining film PDL. In the present disclosure, each of the light emitting areas PXA-B, PXA-G and PXA-R may correspond to a pixel. The pixel defining film PDL may separate the light emitting elements ED-1, ED-2 and ED-3. The emission layers EL-B, EL-G and EL-R of the light emitting elements ED-1, ED-2 and ED-3 may be disposed in an opening OH defined by the pixel defining film PDL and separated by the pixel defining film PDL.

The pixel defining film PDL may be formed of a polymer resin. For example, the pixel defining film PDL may be formed by including (e.g., may be formed of) a polyacrylate-based resin or a polyimide-based resin. Also, the pixel defining film PDL may be formed by further including an inorganic material in addition to the polymer resin. In one embodiment, the pixel defining film PDL may be formed by including (e.g., further including) a light absorbing material, and/or may be formed by including (e.g., further including) a black pigment and/or a black dye. The pixel defining film PDL formed by including a black pigment and/or a black dye may implement a black pixel defining film. When forming the pixel defining film PDL, carbon black may be utilized as the black pigment or the black dye, but the present disclosure is not limited thereto.

In addition, the pixel defining film PDL may be formed of an inorganic material. For example, the pixel defining film PDL may be formed by including (e.g., may be formed of) silicon nitride (SiNx), silicon oxide (SiOx), silicon oxide (SiOxNy), etc. The pixel defining film PDL may define light emitting areas PXA-B, PXA-G, and PXA-R. The light emitting areas PXA-B, PXA-G, and PXA-R and a non-light emitting area NPXA may be separated by the pixel defining film PDL.

Each of the light emitting elements ED-1, ED-2 and ED-3 may include a first electrode EL1, a hole transport region HTR, emission layers EL-B, EL-G and/or EL-R respectively, an electron transport region ETR, and a second electrode EL2. The same description with reference to FIG. 3 may be applied to the first electrode EL1, the hole transport region HTR, the electron transport region ETR, and the second electrode EL2, except that quantum dot composites QD-C1, QD-C2, and QD-C3 included in the emission layers EL-B, EL-G, and EL-R are different from each other in the light emitting elements ED-1, ED-2, and ED-3 included in the display device DD of an embodiment.

The encapsulation layer TFE may cover the light emitting elements ED-1, ED-2 and ED-3. The encapsulation layer TFE may be one layer or a plurality of layers laminated (e.g., stacked) over one another. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

In FIG. 13, the hole transport region HTR and the electron transport region ETR are illustrated to be provided as a common layer while covering the pixel defining film PDL, but the present disclosure is not limited thereto. In an embodiment, the hole transport region HTR and the electron transport region ETR may be disposed in the opening (e.g., disposed only in the opening) OH defined by the pixel defining film PDL.

In an embodiment illustrated in FIG. 13, the light control layer PP may include a color filter layer CFL. That is, the display device DD of an embodiment may further include the color filter layer CFL disposed on the light emitting elements ED-1, ED-2, and ED-3 of the display panel DP.

In the display device DD of an embodiment, the light control layer PP may include a base layer BL and a color filter layer CFL.

The base layer BL may be a member that provides a base surface on which the color filter layer CFL is disposed. The base layer BL may be a glass substrate, a metal substrate, a plastic substrate, etc. However, the present disclosure is not limited thereto, and the base layer BL may be an inorganic layer, an organic layer, or a composite material layer.

The color filter layer CFL may include a light blocking unit BM and a color filter CF. The color filter may include a plurality of filters CF-B, CF-G, and CF-R. That is, the color filter layer CFL may include a first filter CF-B for transmitting a first color light, a second filter CF-G for transmitting a second color light, and a third filter CF-R for transmitting a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or a dye. The first filter CF-B may include a blue pigment or a blue dye, the second filter CF-G may include a green pigment or a green dye, and the third filter CF-R may include a red pigment or a red dye.

However, the present disclosure is not limited thereto and the first filter CF-B may not include a pigment or a dye. The first filter CF-B may include a polymer photosensitive resin, but may not include any pigment or dye. The first filter CF-B may be transparent. The first filter CF-B may be formed of a transparent photosensitive resin.

The light blocking unit BM may be a black matrix. The light blocking unit BM may be formed by including (e.g., may be formed of) an organic light blocking material or an inorganic light blocking material, each including a black pigment or a black dye. The light blocking unit BM may reduce or prevent a light leakage phenomenon and distinguish the boundaries between the adjacent filters CF-B, CF-G, and CF-R.

The color filter layer CFL may further include a buffer layer BFL. For example, the buffer layer BFL may be a protection layer for protecting the filters CF-B, CF-G, and CF-R. The buffer layer BFL may be an inorganic material layer including at least one inorganic material selected from silicon nitride, silicon oxide, and silicon oxynitride. The buffer layer BFL may be formed of a single layer or a plurality of layers.

In the embodiment shown in FIG. 13, the first color filter CF-B of the color filter layer CFL is illustrated to overlap the second filter CF-G and the third filter CF-R, but the present disclosure is not limited thereto. For example, the first to third filters CF-B, CF-G and CF-R may be separated by the light blocking unit BM and non-overlapped with each other. In an embodiment, each of the first to third filters CF-B, CF-G and CF-R may be disposed correspondingly to each of the respective blue emission area PXA-B, green emission area PXA-G and red emission area PXA-R.

In an embodiment, unlike what is shown in FIG. 13 and the like, the display device DD of an embodiment may include a polarization layer as a light control layer PP instead of the color filter layer CFL. The polarization layer may block external light provided to the display panel DP from the outside. The polarization layer may block a part of the external light.

Figure 14:
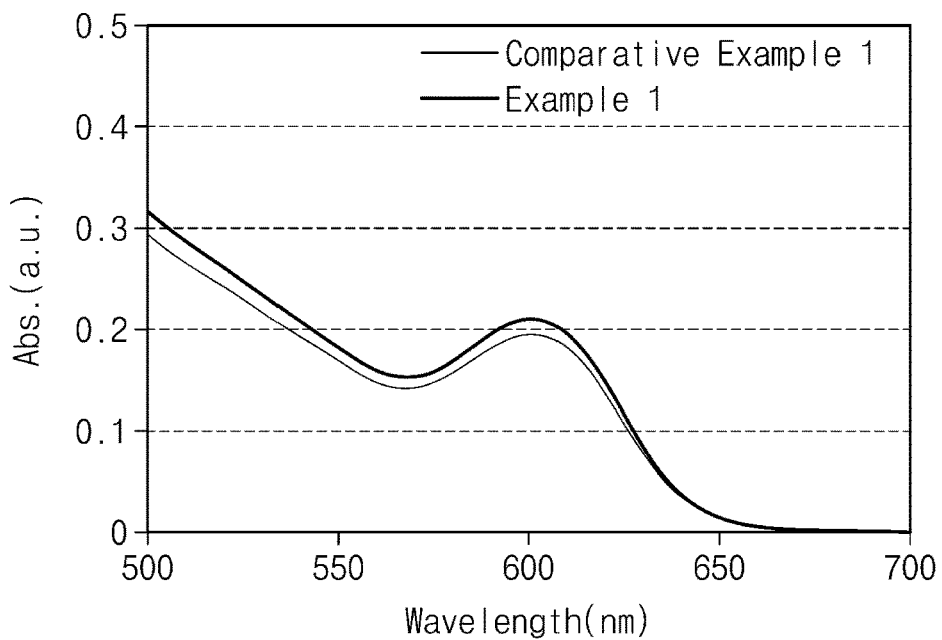
FIG. 14 is a graph illustrating the absorbance of a quantum dot composition according to wavelength.

FIG. 14 is a graph showing the absorbance (Abs.) of a quantum dot composition according to wavelength. Comparative Example 1 is a quantum dot composition from which a free ligand is removed utilizing a polar solvent and a nonpolar solvent, and Example 1 is a quantum dot composition from which a free ligand is removed utilizing an adsorbent according to an embodiment. The quantum dot compositions of Comparative Example 1 and Example 1 are each manufactured at the same concentration of 1 mg/ml.

Referring to the graph of FIG. 14, it can be confirmed that Example 1 has superior (e.g., higher) absorbance to Comparative Example 1 at the same wavelength of 650 nm or less. At a wavelength of 600 nm, the absorbance of Comparative Example 1 is 0.19 and the absorbance of Example 1 is 0.21. The absorbance is proportional to the concentration of quantum dots, and thus the greater the amount of the free ligand is removed, the greater the absorbance value may become. As the absorbance of Example 1 showed a higher value than the absorbance of Comparative Example 1, it can be seen that the amount of the free ligand that is not removed (e.g., the amount of the residue free ligand) in Example 1 was smaller than that of Comparative Example 1.

Figure 15:
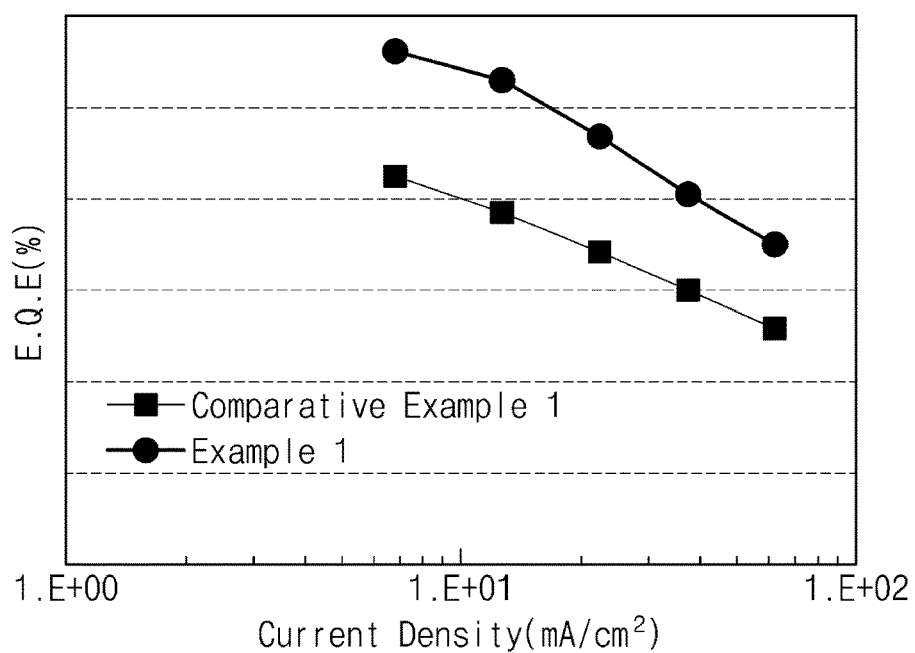
FIG. 15 is a graph illustrating luminous efficiency of a light emitting element according to current density.

FIG. 15 is a graph showing luminous efficiency (E.Q.E) of a light emitting element according to current density. Comparative Example 1 is a light emitting element including a quantum dot composition from which the free ligand is removed utilizing a polar solvent and a nonpolar solvent. Example 1 is a light emitting element including a purified quantum dot composition according to a method for manufacturing a light emitting element of an embodiment. Current-voltage-luminance (IVL) for each element of Comparative Example 1 and Example 1 was measured and compared.

When the current amount was increased while gradually increasing voltage, the luminance change of each light emitting element was measured, and the luminance amount relative to the unit current amount is shown in FIG. 15.

Referring to the graph of FIG. 15, it can be seen that the luminous efficiency of Example 1 is higher than that of Comparative Example 1 at the same current density. The greater the amount of the free ligand that is not removed (e.g., the greater the amount of the residue free ligand) in a quantum dot composition, the lower the luminous efficiency may become. Thus, it can be seen that a greater amount of the free ligand was removed in Example 1 than in Comparative Example 1.

A method for producing a quantum dot composition of an embodiment includes providing a preliminary quantum dot composition containing a quantum dot to which a ligand (e.g., a first ligand) is bonded and a free ligand, providing an adsorbent to the preliminary quantum dot composition, adsorbing the free ligand to the adsorbent, and removing a modified adsorbent to which the free ligand is adsorbed to provide a quantum dot composition from which the free ligand is removed.

A method for manufacturing a light emitting element of an embodiment includes forming a first electrode, forming a hole transport region on the first electrode, forming an emission layer having a purified quantum dot composition on the hole transport region, forming an electron transport region on the emission layer, and forming a second electrode. The forming of the emission layer may include providing a purified quantum dot composition, the providing of the purified quantum dot composition may include the method for producing the quantum dot composition of an embodiment. A light emitting element including the purified quantum dot composition according to an embodiment may have improved luminous efficiency.

A method for producing a quantum dot composition of an embodiment may include providing an adsorbent and adsorbing a free ligand to the adsorbent to provide a quantum dot composition from which the free ligand is removed.

A method for manufacturing a light emitting element of an embodiment may include the method for producing the quantum dot composition according to an embodiment, and include the quantum dot composition from which the free ligand is removed in the light emitting element to achieve improved luminous efficiency.

Although the present disclosure has been described with reference to a preferred embodiment of the present disclosure, it will be understood that the present disclosure should not be limited to these preferred embodiments but various changes and modifications can be made by those skilled in the art without departing from the spirit and scope of the present disclosure.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

The terminology used herein is for the purpose of describing particular example embodiments only and is not intended to be limiting of the invention. As used herein, the singular forms "a," "an" and "the" are intended to include the plural forms as well, unless the context clearly indicates otherwise.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Accordingly, the technical scope of the present disclosure is not intended to be limited to the contents set forth in the detailed description of the specification, but is intended to be defined by the appended claims, and equivalents thereof.

What is claimed is:

1. A method for producing a quantum dot composition, the method comprising:
   providing a preliminary quantum dot composition comprising a first ligand, a quantum dot bonded to the first ligand, and a free ligand;
   providing an adsorbent to the preliminary quantum dot composition;
   adsorbing the free ligand to the adsorbent to produce a modified adsorbent; and removing
   the modified adsorbent to which the free ligand is adsorbed,
   wherein the adsorbent comprises a metal oxide, a metal sulfide, CdSe, CdTe, ZnSe, ZnTe, GaAs, GaP, GaSb, HgSe, and/or InGaP, and wherein the adsorbing of the free ligand to the adsorbent comprises ultrasonic decomposition or heat treatment.

2. The method of claim 1, wherein the first ligand and the free ligand each comprise a head portion and a chain portion.

3. The method of claim 2, wherein the head portion of the free ligand is bonded to the adsorbent.

4. The method of claim 2, wherein the head portion comprises a silyl group, a thiol group, or a carboxylic acid group.

5. The method of claim 2, wherein the chain portion comprises an alkyl group having 3 to 20 carbon atoms.

6. The method of claim 1, wherein the removing of the modified adsorbent comprises centrifugation.

7. The method of claim 1, wherein the quantum dot comprises a core and a shell surrounding the core.

8. The method of claim 1, wherein the adsorbent is about 50 wt % to about 91 wt % with respect to a total weight of the preliminary quantum dot composition.

9. The method of claim 1, wherein the preliminary quantum dot composition further comprises an organic solvent.

10. The method of claim 1, wherein:
the metal oxide comprises $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, and/or $CoMn_2O_4$, and the metal sulfide comprises CdS, ZnS, HgS, ZnSeS, and/or ZnTeS.

11. A method for manufacturing a light emitting element, the method comprising:
forming a first electrode;
forming a hole transport region on the first electrode;
forming an emission layer comprising a purified quantum dot composition on the hole transport region;
forming an electron transport region on the emission layer; and
forming a second electrode on the electron transport region,
wherein the forming of the emission layer comprises:
providing the purified quantum dot composition; and
forming the emission layer with the purified quantum dot composition,
wherein the providing of the purified quantum dot composition comprises:
providing a preliminary quantum dot composition comprising a first ligand, a quantum dot bonded to the first ligand, and a free ligand;
providing an adsorbent to the preliminary quantum dot composition;
adsorbing the free ligand to the adsorbent to produce a modified adsorbent; and
removing the modified adsorbent to which the free ligand is adsorbed, and
wherein the adsorbent comprises a metal oxide, a metal sulfide, CdSe, CdTe, ZnSe, ZnTe, GaAs, GaP, GaSb, HgSe, and/or InGaP, and
wherein the adsorbing of the free ligand to the adsorbent comprises ultrasonic decomposition or heat treatment.

12. The method of claim 11, wherein the first ligand and the free ligand each comprise a head portion and a chain portion.

13. The method of claim 12, wherein the head portion of the free ligand is bonded to the adsorbent.

14. The method of claim 12, wherein the head portion comprises a silyl group, a thiol group, or a carboxylic acid group.

15. The method of claim 12, wherein the chain portion comprises an alkyl group having 3 to 20 carbon atoms.

16. The method of claim 11, wherein the quantum dot comprises a core and a shell surrounding the core.

17. The method of claim 11, wherein the providing of the purified quantum dot composition comprises inkjet printing.

18. The method of claim 11, wherein the purified quantum dot composition is formed from the preliminary quantum dot composition and the preliminary quantum dot composition further comprises an organic solvent.

* * * * *